United States Patent
Chen et al.

[19]

[11] Patent Number: 6,110,530
[45] Date of Patent: Aug. 29, 2000

[54] CVD METHOD OF DEPOSITING COPPER FILMS BY USING IMPROVED ORGANOCOPPER PRECURSOR BLEND

[75] Inventors: Ling Chen; Seshadri Ganguli, both of Sunnyvale; Bo Zheng, San Jose; Samuel Wilson, Sunnyvale; Christophe Marcadal, Santa Clara, all of Calif.

[73] Assignee: Applied Materials, Inc., Santa Clara, Calif.

[21] Appl. No.: 09/339,970

[22] Filed: Jun. 25, 1999

[51] Int. Cl.$^7$ .................................................. C23C 16/18
[52] U.S. Cl. ...................... 427/253; 427/124; 427/252; 427/255.23; 427/255.28; 427/250
[58] Field of Search .................................. 427/250, 124, 427/253, 255.23, 255.28, 252

[56] References Cited

U.S. PATENT DOCUMENTS

| | | | |
|---|---|---|---|
| Re. 35,614 | 9/1997 | Norman et al. | 427/250 |
| 5,085,731 | 2/1992 | Norman et al. | 156/646 |
| 5,098,516 | 3/1992 | Norman et al. | 156/666 |
| 5,744,192 | 4/1998 | Nguyen et al. | 427/99 |

FOREIGN PATENT DOCUMENTS 9-296269  11/1997  Japan .

OTHER PUBLICATIONS

Kim et al, J. Appl. Phys. 78(1), pp. 245–250, Jul. 1995.
Norman et al, "Chemical additives for improved copper chemical vapour deposition processing" Thin Solid Films 262 (1995) pp. 45–51.
Hochberg et al, Chemical Additives for improved copper CVD processing using (HFAC)Cu(TMVS), Conf. Proced. ULSI–X, 1995, Materials REsearch Soc.
Jain et al, "Chemical Vapor Deposition of Copper from (hfac)CuL(L=VTMS and 2–Butyne)in the Presence of Wayter, Methanol and Dimethyl Ether", Chem. Mater. 1996, vol. 8, pp. 1119–1127.
Gelatos et al, "Chemical vapor deposition of copper from Cu+1 precursors in the presence of water vapor", Appl. Phys. Lett. 63 (20) Nov. 15, 1993, pp. 2842–2844.

*Primary Examiner*—Roy V. King
*Attorney, Agent, or Firm*—Birgit E. Morris

[57] ABSTRACT

Copper films having improved properties are deposited by chemical vapor deposition from an organocopper precursor of a blend of copper hexafluoroacetylacetonate trimethylvinylsilane and from about 1.0 to 5.0 percent by weight of trimethylvinylsilane that is vaporized in a vaporizer, and passed into a chemical vapor deposition chamber. Separately up to about 2 percent by weight of the precursor blend of water vapor is added directly to the chamber.

4 Claims, 2 Drawing Sheets

6,110,530

CVD METHOD OF DEPOSITING COPPER FILMS BY USING IMPROVED ORGANOCOPPER PRECURSOR BLEND

This invention relates to improved organocopper precursors and to chemical vapor deposited copper films. More particularly, this invention relates to a more thermally stable copper precursor to deposit copper films having low resistivity and improved morphology, and to a method for making such copper films with high throughput and reduced particulate contamination.

BACKGROUND OF THE INVENTION

As integrated circuits become smaller and more dense, the metal interconnects must be made narrower, and electromigration of the metal becomes more of a problem. Aluminum has been the metal of choice for some time, because it is readily deposited, is conductive and, when mixed with silicon, has adequate electromigration properties. However, as design rules are reduced to less than one-quarter micron, the limit of line widths for aluminum is being reached.

Because of its increased conductivity, the use of copper lines and vias for small design rule integrated circuits becomes more attractive, because copper lines can be about one-half the width required for aluminum lines. However, the use of copper has been limited heretofore because elevated temperatures must be used for deposition and removal, when the danger of electromigration of the copper into adjacent devices increases.

Recently, several references have appeared directed to a chemical vapor deposition process for depositing copper films from an organic precursor, hexafluoroacetylacetonate-Cu-trimethylvinylsilane (hereinafter hfac-Cu-TMVS). This precursor dissociates at comparatively low temperatures, i.e., below 200° C., to produce copper films having a low film resistivity. However, the resultant copper film has poor adhesion to underlying surfaces, particularly to TiN or Ta barrier layers, and the precursor is not particularly stable at room temperature or higher. Further, the deposition rate of copper is low.

Thus the use of various additives have been proposed for combination with the hfac-Cu-TMVS precursor to improve the film quality, deposition rate and the thermal stability of the precursor. The addition of water vapor to the copper precursor, as disclosed by Galatos et al, Appl. Phys. Lett. 63 (20), Nov. 15, 1993 pp 2842–2844, improved the deposition rate, but degraded the resistivity. Hochberg et al, in Conf. Proceed ULSI-X, 1995, of Materials Research Soc., discloses the addition of water by using the dihydrate form of hfac-Cu-TMVS. This improved the stability of the copper precursor, and the copper deposition rate. However, the copper films had low conductivity and they were rough, indicating the presence of particles. Jaim et al, in Chem. Mater. 1996, Vol. 8, pp 1119–1127, discloses the deposition of copper from hfac-Cu-TMVS and 2-butyne, also adding water to the copper precursor. However, the resistivity of the deposited copper films was high.

Nguyen, U.S. Pat. No. 5,744,192 discloses the addition of water to the above copper precursor at a chamber pressure of 0.3–3% and up to 5% by weight of additional TMVS to increase the stability of the precursor. Up to 0.4% by weight of protonated hfac (Hfac) can also be added to increase the deposition rate of the copper. However, this blend of the copper precursor is inadequate for a commercial process, and the film morphology, resistivity and purity level of the deposited copper films are inadequate.

At present, the most widely used copper precursor for CVD of copper is a blend of hfac-Cu-TMVS, an extra 2.5 percent by weight of TMVS and 0.4 percent by weight of H(fac)dihydrate (HDH). The intention of this blend is to improve the thermal stability of the copper precursor by adding extra TMVS, and to improve the deposition rate of copper by adding extra HDH. This blend is available from Schumacher Co. as "Blend 2504". However, the thermal stability of this blend is poor even with the extra 2.5% by weight of TMVS, because the HDH accelerates the decomposition of the precursor at relatively low temperatures. Decomposition of the copper precursor in the vaporizer used to pass the gaseous precursor to the deposition chamber leads to particles of deposit material being formed well before they reach the wafer, and poor adhesion of the film to the wafer. Further, because the chemical control of the blend components is difficult, the HDH concentration varies through each quantity of the blend.

The prior art method for using the above blend to deposit copper on a wafer is to add the copper precursor and blending ingredients (hfac and TMVS) to a vaporizer where the liquids are vaporized, after which the vapor passes to the CVD chamber where it decomposes and deposits copper on a substrate.

Thus a TMVS copper precursor blend that has improved stability, and an improved method of depositing copper having improved morphology, and lower copper resistivity, would be highly desirable.

SUMMARY OF THE INVENTION

We have found that a blend of hfac-Cu-TMVS and from 1.5 to 2.5% by weight of extra TMVS that does not include HDH, has improved thermal stability at room temperature over time as compared to the prior art blend. This blend is vaporized and then introduced to the deposition chamber, where a small amount of water is added directly and separately from the vaporized copper precursor blend to the processing chamber. This results in eliminating the decomposition of the precursor in the vaporizer. The copper films deposited according to the method of this invention have improved morphology and lower resistivity as compared to prior art copper deposits. The blend of the invention includes sufficient TMVS so that the precursor is stabilized. During the process of deposition, the above blend is passed to a vaporizer, and the vapor is introduced into a chemical vapor deposition chamber. A small amount of water vapor is introduced separately and directly into the processing chamber, such as into the gas inlet manifold. A deposited copper film that has good adhesion to a substrate, that has low resistivity, high reflectivity, and improved morphology is obtained at a high deposition rate.

DETAILED DESCRIPTION OF THE INVENTION

Figure 1:
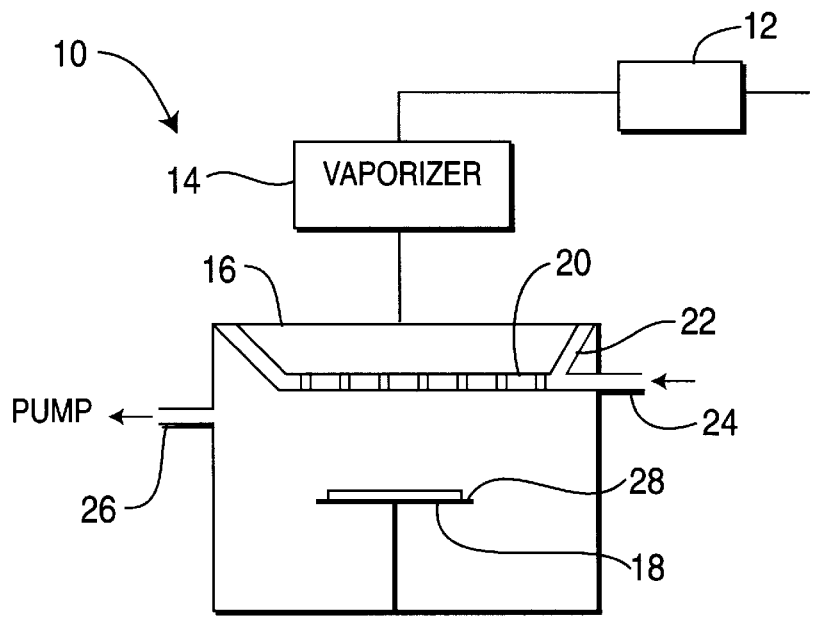
FIG. 1 is a schematic diagram of a chemical vapor deposition system useful for depositing copper films in accordance with the invention.

FIG. 1 is a schematic diagram of a system in which the method of the present invention can be carried out.

A system 10 includes a vessel 12 containing hfac-Cu-TMVS and extra TMVS. The blend contains from about 1.5 to about 2.5% by weight of TMVS. The blend is passed into a vaporizer 14 wherein the blend is vaporized. No water is added to the vaporizer 14. The blended vapor is introduced in turn to a CVD chamber 16. The chamber 16 includes a susceptor 18 for supporting a substrate to be processed. A showerhead 20 is mounted so that it is spaced from and parallel to the susceptor 18, and is connected to a line 22 leading from the vaporizer, and to an inlet 24 for water vapor. An exhaust line 26 leads to a vacuum pump (not shown) for exhausting gases and deposition byproducts from the chamber 16. A copper film is deposited onto the substrate 28 supported by the susceptor 18 via a disproportionation reaction, as

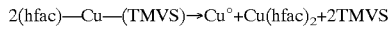

$$2(hfac)-Cu-(TMVS) \rightarrow Cu^\circ + Cu(hfac)_2 + 2TMVS$$

The blends of the invention include hfac-Cu-TMVS and from 1.5 to 2.5% by weight of extra TMVS. The blend is mixed with a small amount, e.g., up to about 2 percent by weight, and preferably about 0.5 percent by weight of the precursor of water vapor fed directly to the chamber.

A series of comparison tests were made on copper films made in accordance with a prior art blend of hfac-Cu-TMVS, and 2.5% by weight of TMVS and 0.4% of HDH, and a blend of the present invention including 1.5% by weight of extra TMVS.

Figure 2:
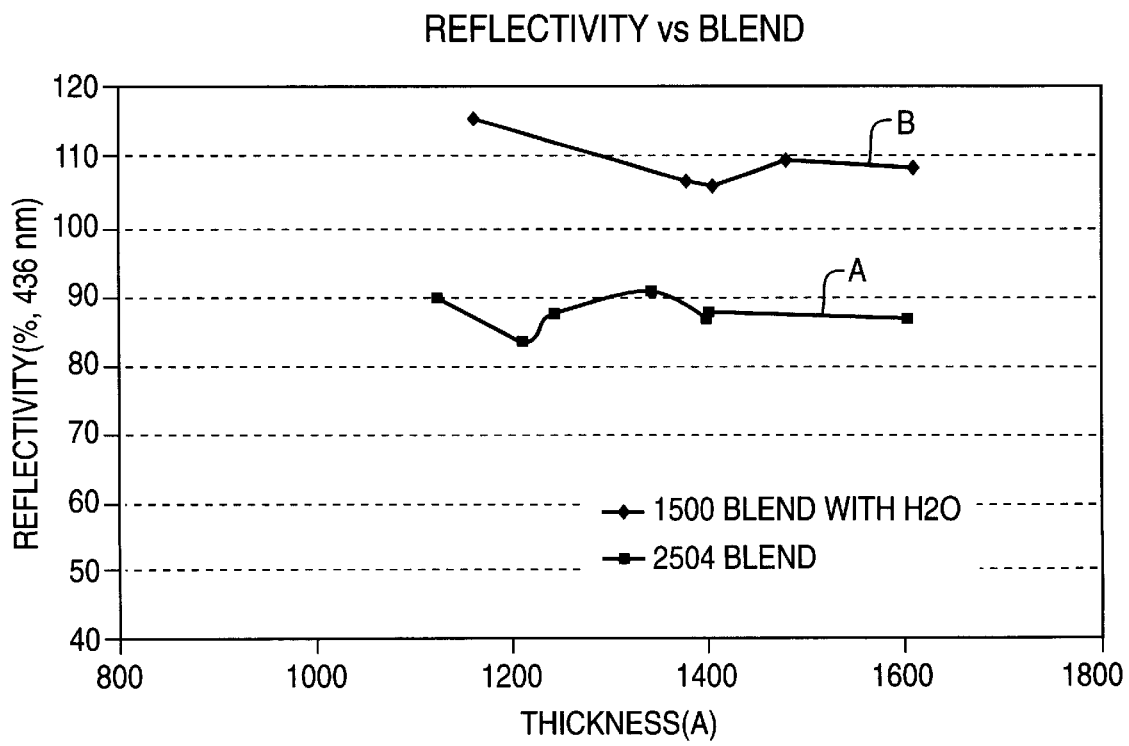
FIG. 2 is a graph of percent reflectivity at 436 nm versus the thickness of copper films deposited in accordance with the prior art and in accordance with the present invention.

The reflectivity of the deposited copper films were measured using a 436 nm light source as a function of thickness in angstroms of the copper film. The resultant copper film of the invention had a higher reflectivity than the copper films deposited with the prior art blend, as shown in FIG. 2, wherein line A is copper deposited using the blend of the prior art and line B is copper deposited using a blend of the present invention including 1.5% by weight of extra TMVS. It is apparent that the reflectivity, and thus the morphology, of the copper films deposited in accordance with the present invention is improved by about 20%.

Figure 3:
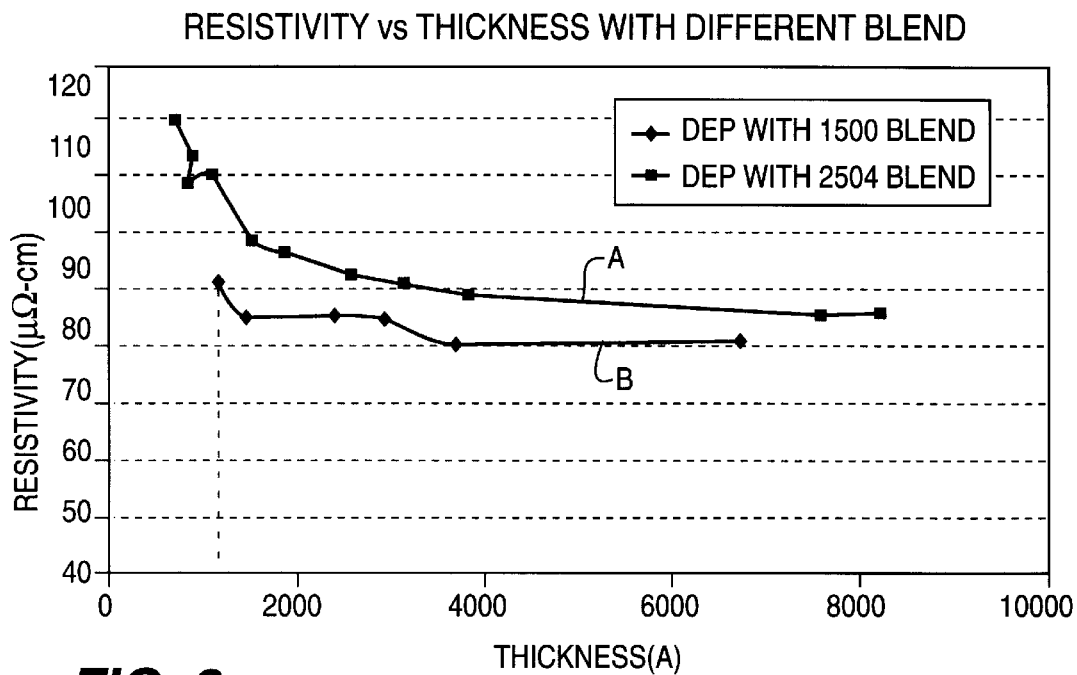
FIG. 3 is a graph of resistivity versus thickness of copper films deposited in accordance with the prior art and in accordance with the present invention.

The resistivity of the copper deposited using the same blend of the invention was also compared to blend 2504 as described hereinabove, as shown in FIG. 3. The resistivity of copper deposited using 1.5% by weight of extra TMVS expressed in $\mu\Omega$-cm versus thickness of the film in angstroms. It is apparent that the copper films deposited in accordance with the invention (line B) have lower resistivity than the copper film deposited using the prior art blend (line A).

A blend of the present invention and of the prior art were also compared for thermal stability. Copper films were deposited from a blend of 1.5% by weight of extra TMVS and the prior art blend 2504 over TiN barrier layers. The copper coated wafers were heated at 75° C., the same temperature as the vaporizer, for one hour. The copper layer of the present invention had a weight gain of less than 0.1 mg (which is the sensitivity limit of the balance used). The copper layer of the prior art however had a weight gain of 29.2 mg; illustrating the greatly improved thermal stability of the present copper precursors.

Figure 4:
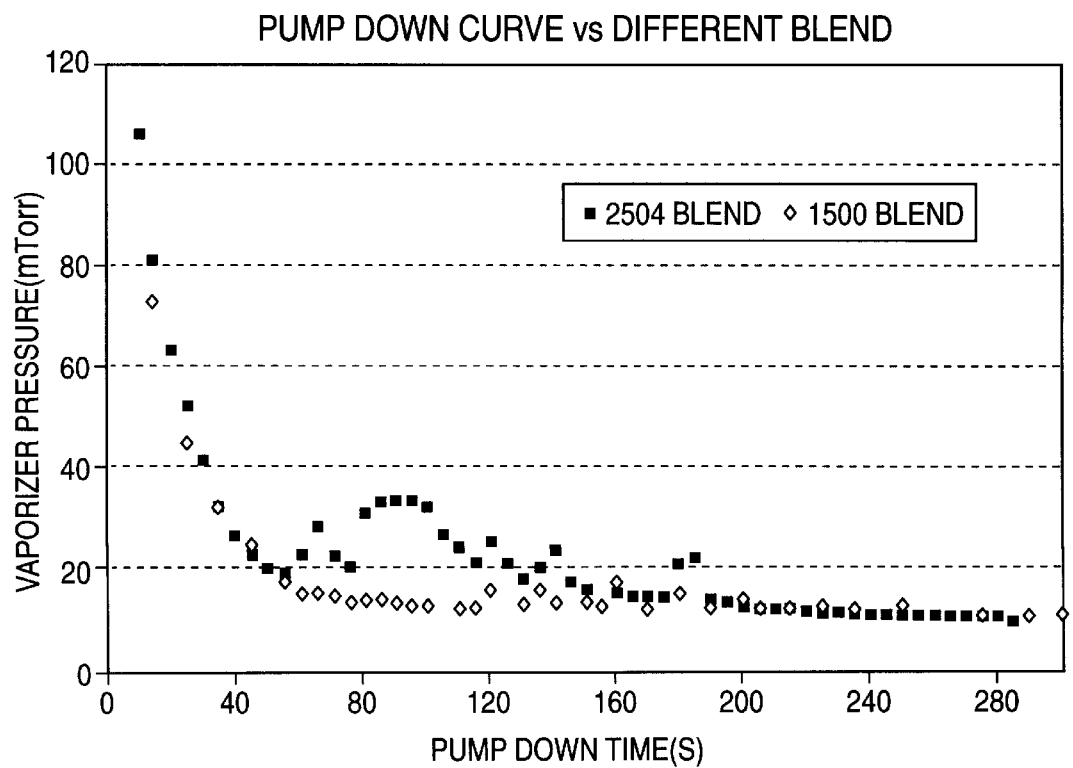
FIG. 4 is a graph of vaporizer pressure versus pump down time for a blend of the prior art and for a blend of the present invention.

The vaporizer using the present precursor blends more rapidly achieves process pressure for copper deposition than the blend of the prior art. Using the same deposition time and copper precursor flow rates to the vaporizer, the vaporizer could be pumped down more quickly when the present blend is used, as shown in FIG. 4. In FIG. 4, the squares show the pump down time in seconds of the vaporizer using the prior art blend, and the triangles show the pump down time of the vaporizer when the present precursor blend is used, using 1.5% by weight of extra TMVS. The data clearly shows that the pump down time of the vaporizer using the present blend stabilizes after about 60 seconds, whereas the vaporizer using the prior art blend does not stabilize until after about 150 seconds. Thus using the blends of the invention, down time is reduced and concomitantly throughput is improved, with a reduction in particle formation and residue, leading to improved copper film morphology.

A blend B was made of hfac-Cu-TMVS and 1.5% of extra TMVS to which a small amount of water was added directly to the processing chamber. The resultant copper layer was measured and tested for various parameters which are listed below. A comparison was made to the prior art blend as described above.

| Parameter | Blend B | Blend 2504 |
|---|---|---|
| Deposition Rate, Å/min | 1000 | 400 |
| Uniformity, % | 5 | 5 |
| Reflectivity, 1000Å | 115 | 90 |
| Resistivity, 1500Å | 2.2 $\mu\Omega$-cm | 2.5 $\mu\Omega$-cm |
| Step Coverage, % | 100 | 100 |
| Adhesion as Dep, J/m$^2$ | 2.16 | 2.14 |
| Adhesion after Anneal | >5.0 | >5.0 |
| Thermal Stability* | no deposit | 29.4 mg as dark powder |
| Film Impurity Levels | F: $3 \times 10^{17}$ | F: $2 \times 10^{19}$ |
|  | C: $5 \times 10^{17}$ | C: $5 \times 10^{18}$ |
|  | O: $1.3 \times 10^{18}$ | O: $5 \times 10^{21}$ |
| Cost per wafer, 500Å | $0.30 | $0.69 |

*film deposited at 100° C. for a period of one hour

Thus the present blend is superior to that of the prior art in several important respects; the deposition rate is 2.5 times higher; the reflectivity is higher; the thermal stability is much higher and the impurities in the copper film are much lower. Thus the present blends have improved properties and lower costs, which makes the present method production worthy for state-of-the-art semiconductor devices.

Although the present invention has been illustrated using specific embodiments, the invention is not meant to be limited to the details herein. One skilled in the art can readily change the proportions of the blend ingredients and the like and such changes are meant to be included herein. The invention is only to be limited by the scope of the accompanying claims.

We claim:

1. A method of depositing copper films by chemical vapor deposition comprising forming a blend of copper hexafluoroacetylacetonate trimethylvinylsilane precursor and a sufficient amount of trimethylvinylsilane to stabilize the precursor, passing said blend to a vaporizer for vaporizing said blend, introducing said blend to a chemical vapor deposition chamber, introducing up to about 2.0 percent by weight of water vapor based on the weight of the precursor blend separately and directly into said chamber, and depositing a copper film onto a substrate mounted in said chamber.

2. A method according to claim 1 wherein from about 1.0 to 5.0 percent by weight of trimethylvinylsilane is added to the copper precursor.

3. A method according to claim 2 wherein from about 1.5 to about 2.5 percent by weight of trimethylvinylsilane is added to the copper precursor.

4. A method according to claim 1 wherein about 0.5 percent by weight of water vapor based on the amount of precursor blend is introduced to said chamber.

* * * * *